March 24, 1970 L. F. MAYLE 3,502,801

SEARCH TUNING APPARATUS FOR CONTINUOUS AND DETENT-TYPE TUNERS

Filed Jan. 13, 1966 4 Sheets-Sheet 1

INENTOR.
LOUIS F. MAYLE

BY Lockwood, Woodard, Smith & Weikart
Attorneys

INVENTOR
LOUIS F. MAYLE
BY Lockwood, Woodard, Smith & Weikart
Attorneys

March 24, 1970 L. F. MAYLE 3,502,801

SEARCH TUNING APPARATUS FOR CONTINUOUS AND DETENT-TYPE TUNERS

Filed Jan. 13, 1966 4 Sheets-Sheet 3

INVENTOR
LOUIS F. MAYLE

BY Lockwood, Woodard, Smith & Weikart
Attorneys

SEARCH TUNING APPARATUS FOR CONTINUOUS AND DETENT TYPE TUNERS

Filed Jan. 13, 1966

INVENTOR.
LOUIS F. MAYLE
BY
Lockwood, Woodard, Smith & Weikart
Attorneys

United States Patent Office 3,502,801

Patented Mar. 24, 1970

3,502,801

SEARCH TUNING APPARATUS FOR CONTINUOUS AND DETENT-TYPE TUNERS

Louis F. Mayle, Fort Wayne, Ind., assignor to The Magnavox Company, Fort Wayne, Ind., a corporation of Delaware Filed Jan. 13, 1966, Ser. No. 520,407
Int. Cl. H04n 5/44
U.S. Cl. 178—5.8 25 Claims

ABSTRACT OF THE DISCLOSURE

A single reversible motor has a starting circuit with a switch closed in response to manual or electrical stimuli to initiate tuner drive. A motor hold circuit includes a switch opened in response to tuning a satisfactory channel to terminate tuner drive. A manual selector mechanically connects the motor to either a continuous-type UHF or a detented-type VHF tuner. An alternate embodiment uses two motors, one for each tuner, with a manual selector switch enabling one or the other to function. A fine tuning control member and a fine tuning indicator lamp are provided.

This invention relates generally to search tuning or "signal seeking" apparatus for radio and television receivers, and more particularly to apparatus useful not only to a continuous-type of tuner but also a detent-type of tuner.

Although means have been devised for search tuning on continuous (non-detented) types of tuners, particularly in radio receivers, it is desirable to provide search tuning in connection with detent-type tuners such as are often found in VHF television receivers. Heretofore, the stopping on stations or tuner index positions at which an inadequate signal is present, has been avoided by adjusting lugs, pins, tabs or other mechanical devices on the tuner. By so doing, the tuner can be power driven by push-button control at the receiver or at a remote location therefrom, and the tuner will be driven past those rotational positions at which no acceptable signal is present. In many instances such arrangements considerably limit the speed in going from channel to channel, and they require pre-setting the mechanical devices so that the tuner will stop on active channels. Receivers used in various localities would therefore have different settings, and a factory setting would not necessarily be feasible or useful for the receiver at its ultimate point of use.

It is therefore a general object of the present invention to provide a search tuning system capable of operating a continuous type of tuner and also capable of operating a detent-type of tuner, and which enables the use of one system in a receiver having both types of tuners.

A further object is to obtain reliable and accurate tuning on stations where adequate signal reception is attainable, and skip other stations, both when operating the continuous tuner and when operating the detent tuner.

A further object is to provide apparatus facilitating an accurate manual fine tuning adjustment both for the continuous tuner and for the detent tuner.

A further object is to provide apparatus enabling proper search tuning operation regardless of the duration of application of manual force to initiate the search tuning function.

A further object is to obtain a reversible drive for the continuous tuner, but one-way drive for the detent tuner, if desired.

A further object is to provide a device in which good channel reception can be obtained without any pre-setting.

A further object is to provide apparatus enabling transition from channel to channel at greater speeds than those typically employed in existing apparatus.

A further object is to provide a system lending itself to remote control.

Described briefly, one embodiment of the present invention employs a continuous-type UHF tuner and a detent-type VHF tuner, and a coupling from each to a tuner drive motor. A selector is provided so that, upon energization thereof, the motor will drive one or the other of the tuners. The motor is provided with a starting circuit which can be closed manually or by remote control, and a holding circuit which is closed when the motor is started.

In the motor holding circuit, an electrically operable "motor-stopping" switch is provided and this switch is activated by receiver signal responsive means when a station is tuned, to open the holding circuit and stop the tuner drive motor. According to one feature of the invention, however, means for provided to disable the opening of this switch, or to render its opening ineffective to stop the tuner drive motor at any time that the detent tuner is being driven and is not very near to its correct detent position. Nevertheless, the detent means are still used to move the detent tuner to its final stable position at each useful channel.

The electrically operable switch is also employed with a pilot lamp and in cooperation with a switch actuated by the fine tuning knob on the VHF tuner, to employ the pilot lamp as an indicator that correct tuning has been obtained.

Although it is desirable to move the tuner rapidly from channel to channel, one embodiment of the present invention incorporates the motor stopping switch in the starting circuit to avoid skipping stations where a satisfactory signal can be received, regardless of how slowly the user might remove manual pressure from the button which starts the search tuning.

The full nature of the invention will be understood from the accompanying drawings and the following description and claims:

Figure 1:
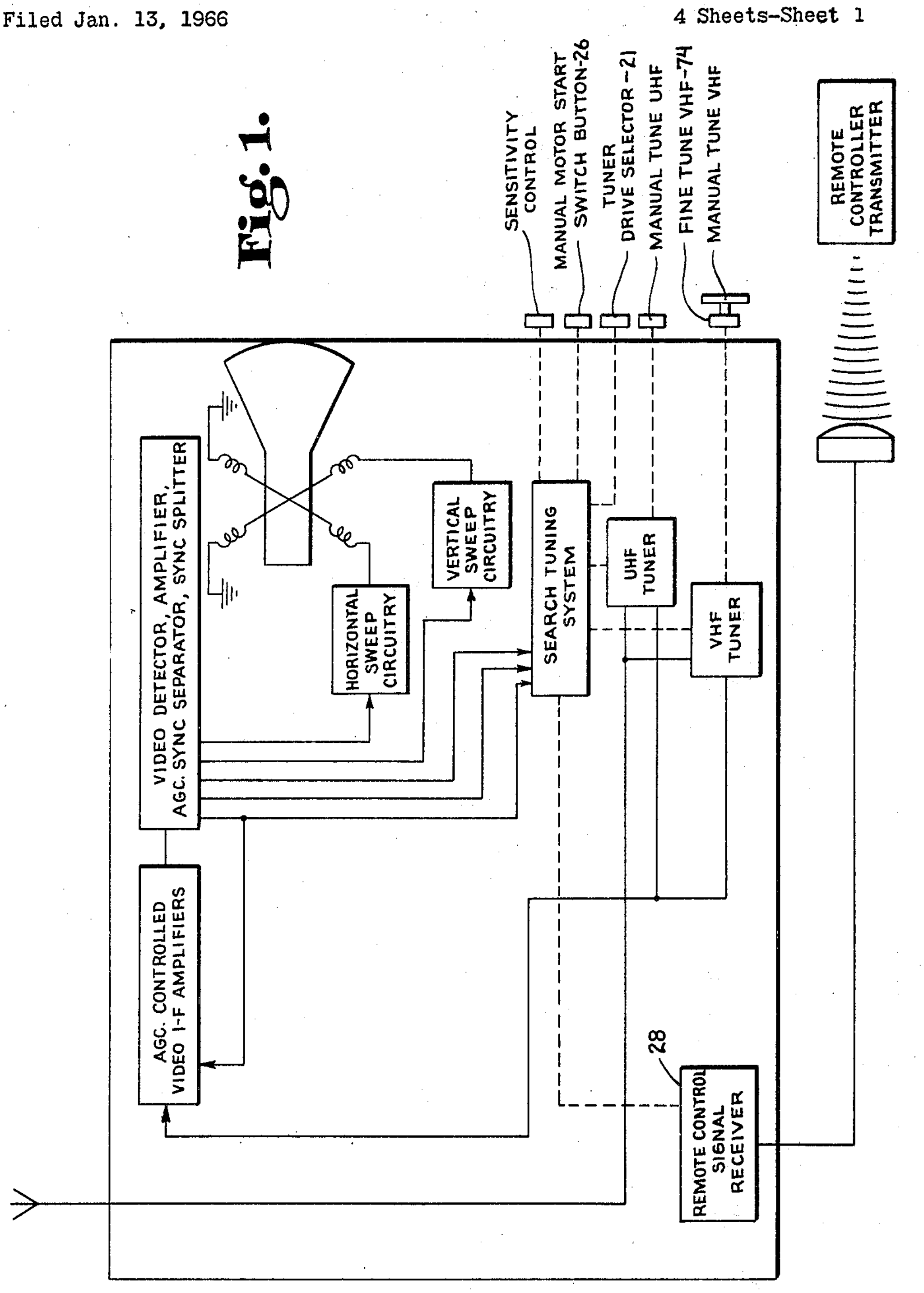
FIGURE 1 is a block diagram of a typical television receiver incorporating the present invention.
Figure 2:
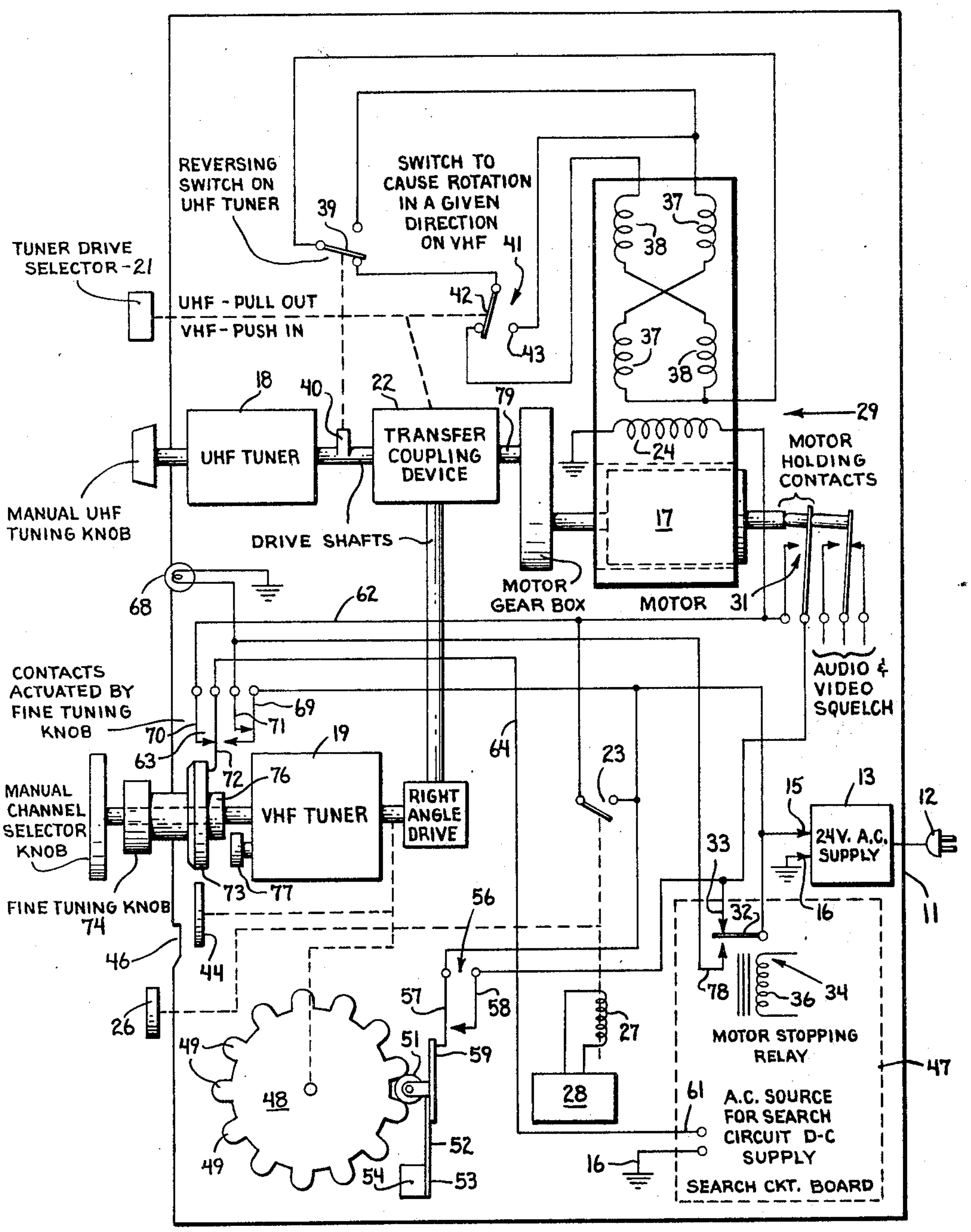
FIGURE 2 is a schematic diagram of one embodiment of the present invention.

Referring now to the drawings in detail, FIGURE 1 represents a conventional television receiver 11 incorporating the present invention therein, and a portion of the receiver according to one embodiment of the invention is shown in detail in FIGURE 2. A power input may be provided by the line plug 12 for the receiver and the voltage may be reduced by means 13 such as a transformer, for example, to provide a 24 volt alternating current supply at the "hot" terminal 15 and grounded terminal 16, for example. A shaded-pole, offset-rotor, tuner-drive motor 17 is provided to drive either the UHF tuner 18 or the VHF tuner 19 as determined by the position of the tuner drive selector button 21. In the FIGURE 2 embodiment the button controls a transfer coupling device 22 to couple either the UHF tuner input shaft or the VHF tuner input shaft to the tuner drive motor output shaft. Each of the tuners is provided with a manual tuning knob as shown for manual tuning independent of the drive motor, according to conventional practice. The VHF tuner is also provided with the fine tuning knob as indicated.

A starting circuit for the drive motor 17 is provided from terminal 15 through the normally open contacts of a motor starting switch 23 through the motor winding 24 back through ground to terminal 16. The starting switch 23 can be closed either by manual actuation of the button 26 or by energization of the solenoid actuator coil 27 therefor in response to a remote control signal received at remote control signal receiver 28 from the remote control transmitter of FIGURE 1. Apparatus for remote control is well known and need not further be described. It is desirable in this embodiment, however, that the start switch automatically open as soon as the motor is started, so the duration of manual force supplied to the button 26 should be short and the same is true if the start switch is actuated by remote control.

As soon as the motor starts, the offset rotor moves in the direction of the arrow 29 to close the contacts 31 of the motor holding switch and complete the motor holding circuit from the supply 13 through conductor 15, through normally closed contacts 32 and 33 of the electrically operable motor stopping relay 34, through the rotor-operated motor holding switch contacts 31 and the motor winding 24 and back through ground to the supply at 16. To break the motor holding circuit for stopping the motor, coil 36 of the motor stopping relay is energized and moves the active contactor 32 away from the passive contactor 33. To operate such a relay in response to tuning of a station, various signal responsive apparatus can be employed in block 47 of FIGURE 2. However, for proper and accurate tuning of a continuous-type tuner in a UHF television receiver, the circuitry shown in FIGURE 5 hereof and described in my co-pending application Ser. No. 386,207, now Patent No. 3,388,215 filed July 30, 1964, and entitled Search Tune System for Television Receivers, provides excellent results.

Figures 3, 5:
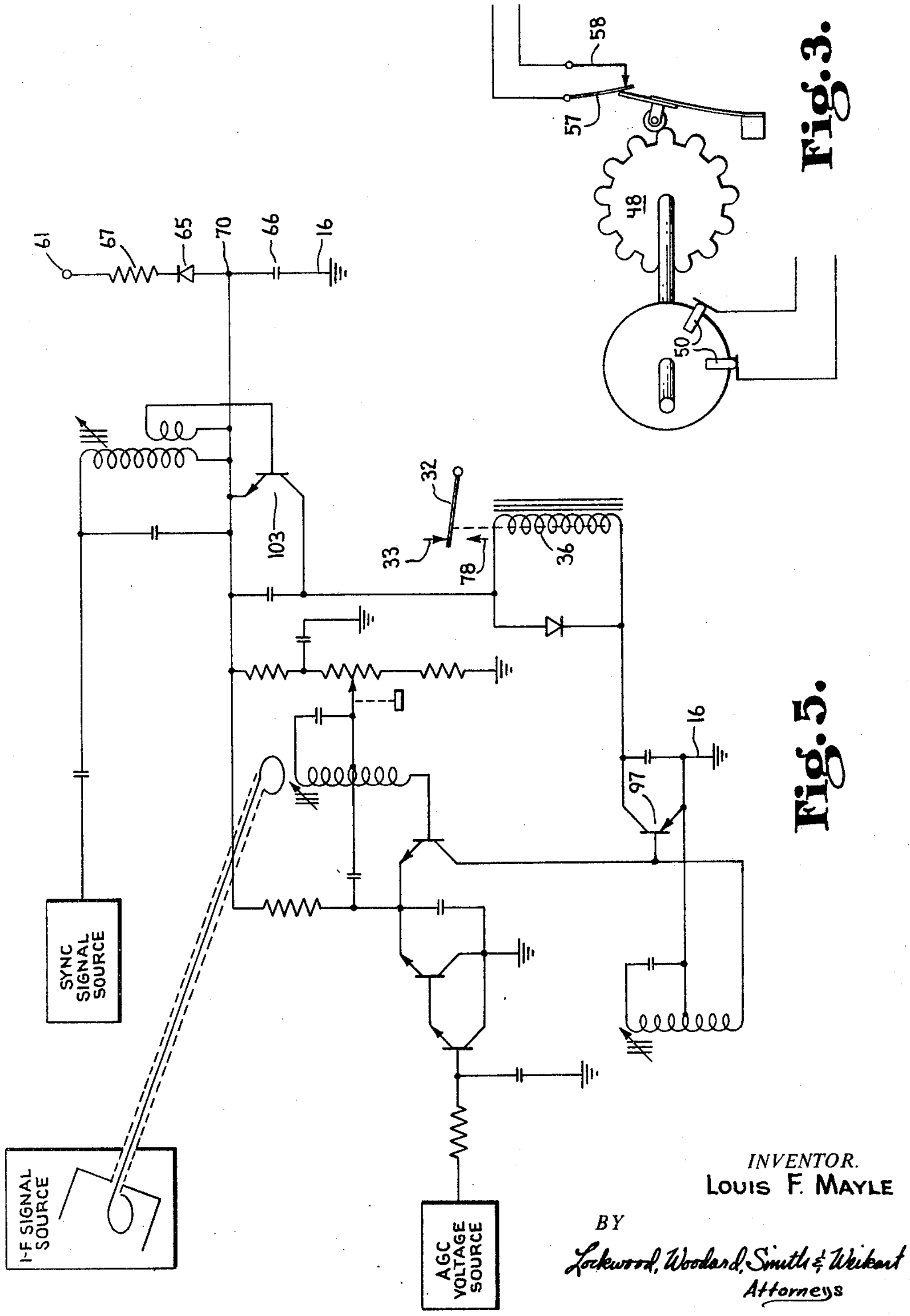
FIGURE 3 is a schematic diagram illustrating a feature of the present invention.
FIGURE 5 is a schematic diagram of signal responsive circuitry useful in the practice of the invention.

Referring to FIGURE 5, coil 36 is the motor stopping relay coil of FIGURE 2 herein, and the ground terminals in FIGURE 5 can be considered to be in common with the terminals 16 of FIGURE 2. The source of energy for the circuit of FIGURE 5 is at terminal 61 and, as shown in FIGURE 2, terminal 61 is energized by the supply 13 through terminal 15 and either the starting switch 23 or the holding switch 31, in the motor starting and holding circuits, respectively, and conductor 62, the normally closed switch 63 and conductor 64. Accordingly, whenever the starting switch 23 is closed, energy is applied at terminal 61 and remains applied thereto until both the starting switch and the holding switch 31, or the switch 63, are opened.

Coil 36 and the load current paths of signal translating devices in the form of transistors 97 and 103 are in series between ground 16 and the lower end of diode 65. When both transistors are conductive (transistor 97 in response to the picture I-F signal and transistor 103 in response to the sync signal) and the potential at junction 70 is of a sufficient negative value, coil 36 is adequately energized to separate the motor stopping switch contactors 32 and 33, breaking the motor holding circuit. As described in the aforementioned application, the capacitor 66 and resistor 67 are normally selected so as to provide a slight time delay from the time the start switch 23 is closed until the time that the coil 36 can be adequately energized to open contacts 32 and 33 of the motor stopping switch 34.

A VHF tuner may normally be provided with a detent wheel 48 having at least thirteen circularly spaced cam lugs 49 thereon for a tuner in which 13 specific stable index positions are desired. The lugs are equally spaced and between each pair of the lugs there is a "valley" in which the cam follower detent roller 51 becomes centered and seated when the tuner is in a proper index position. The follower roller 51 is mounted for rotation on a spring leaf 52 affixed at one end 53 by a post 54 or otherwise to a stationary portion of the tuner. The spring 52 holds the follower in engagement with the detent wheel, and the cam contour and spring force can be selected so that the force of the follower on the cam is able to move the detent wheel and the tuner therewith into a correct and stable index position such as shown in FIGURE 2, from an unstable position such as shown in FIGURE 3.

In contrast, a UHF tuner is normally not detented and is designed to be able to tune up to 82 stations during one rotation thereof. Yet the signal responsive circuitry 47 for controlling the motor stopping relay is used both for search tuning during UHF reception and search tuning during VHF reception according to the present invention.

In order to be able to stop at any one of 82 stations, for example, during one rotation of the UHF tuner, the signal responsive circuitry must be able to promptly open the motor stopping switch contactors 32 and 33 in response to suitable signals received from any one of the 82 stations. However, this could present a problem in using the same system for the VHF tuning where, because of the lesser number of available channels, the tuner strips may be made before the tuner is fully detented. This would tune a station, activate the signal responsive circuitry, energize the motor stopping relay and stop the tuner drive motor before the channel designating number on the channel indicator wheel 44 is in correct registry with the channel indicator window 46 of the receiver. By increasing the spring bias on the detenting means, correct registry might be obtained, but this could result in greater loading of the tuner drive motor. The problem is solved by a feature of the present invention which will now be described.

As shown in FIGURE 2, a switch 56 is connected in parallel with the motor stopping relay switch contacts 32 and 33 to keep the motor running during VHF tuner drive until the follower is almost seated between a pair of cams on the detent wheel. This normally open switch has an active contactor 57 and a passive contactor 58. When the follower roller 51 is seated, the switch 56 will be open. However, the follower has a bar 59 of insulating material affixed to the spring 52 and which is able to move the active contactor 57 to closed condition with the passive contactor 58 as soon as the follower moves out of the seated condition. The switch 56 will remain closed during rotation of the detent wheel until the follower again moves into seated condition on the opposite side of the cam lug which passes it during rotation of the detent wheel. So even if the tuner has been driven sufficiently for the tuner strip contacts 50 of a tuner strip to be made and tune a station, as indicated schematically in FIGURE 3, the switch contacts 57 and 58 will remain closed and keep the motor running until the follower is almost seated.

The cam lug configuration and follower arrangement are such that a very rapid rise of the follower from the seated condition results from a comparatively small angular degree of rotation of the detent wheel. So almost immediately after the starting switch 23 is closed to start the drive motor, the switch 56 is closed. Accordingly, even though the motor stopping switch contacts might be opened soon after pushing the start button, due to the signal on the station at which the tuner was tuned prior to pushing the "start" button 26, the motor will remain running at least until the next "valley" in the detent wheel is reached. In other words, the time delay in negative voltage rise at junction 70 (FIGURE 5) after starting switch closure, is sufficient to permit the rise of the follower to close switch 56 before the stopping relay switch is opened.

The distance between the location of the follower wheel when the switch 56 becomes opened and the follower location when the wheel is seated is comparatively short, and is selected so that this distance will be traveled during rotation of the detent wheel in little more time than it takes for the motor to stop after the holding circuit is broken. This prevents the motor from driving the tuner past a fully detented correct index position where suitable signal reception is attainable.

During search for UHF reception, it may be desirable to rotate the UHF tuner first in one direction through all of the possible stations and then reverse the direction of rotation back to the starting point. For this purpose, the motor 17 is reversible and the windings 37 and 38 are arranged so that the position of the reversing switch contactor 39 will determine the direction of mofor rotation. A reversing switch actuator 40 may be provided on the UHF tuner shaft to change the position of the movable switch contactor 39 at each end of the span of travel of the UHF tuner shaft from the first station to the last station. However, as mentioned above, a feature of the present invention is the provision for search tuning not only of a UHF tuner but also a detent type tuner such as is typically used for VHF reception. Although mechanically feasible, it might be psychologically objectionable to drive the VHF tuner in both directions. Therefore according to another feature of this invention, motor rotation in only one direction when the motor is being used to drive the VHF tuner is achieved by means which will now be described.

A defeat switch 41 is provided with a movable contactor connected to and operated by the tuner drive selector 21. When the selector is pulled out to the position shown in FIGURE 2 for UHF reception, the reversing switch can make a circuit through motor windings 38 for rotation in one direction, and reversing switch contactor 39 can be switched to its other position to make a circuit through windings 37 for motor rotation in the opposite direction. However, when the selector 21 is pushed in for VHF reception, the movable contactor 42 of the defeat switch makes contact with the contactor 43 so that a circuit is always completed through the windings 37 and never through windings 38, regardless of the position of the reversing switch 39. Therefore, the motor rotation for the VHF tuner operation will always be in one direction such that the channel indicator numbers on wheel 44 and appearing in the channel indicator window 46 of the receiver will always increase in value during motor operation of the VHF tuner from the lowest numbered channel to the highest numbered channel and then, when rotation is completed, they will begin again with the lowest numbered channel.

According to another feature of the present invention, a pilot lamp 68 is used to assist in manual fine tuning. It is normally energized from the input terminal 15 through the switch contactors 69 and 71. The switch contactor 72 is made long enough for engagement by the flange 73 of the fine tuning knob 74 when it is pushed inwardly for engagement of the gear 76 with the gear 77 on the VHF tuner. The result is that contactor 72 thereupon closes with contactor 69 and separates it from contactor 71 so as to extinguish the pilot lamp. By closing contactor 72 with contactor 69, the supply for the signal responsive circuitry of FIGURE 5 remains energized from terminal 15 through contactors 69 and 72 and terminal 61. Therefore, when the tuner has been tuned to cause the signal responsive circuitry to respond to correct tuning and open the motor stopping switch, the active contactor 32 thereof breaks with contactor 33 and closes with contactor 78 to complete a circuit from the supply terminal 15 through contactors 32 and 78 and through the pilot lamp 68 back to ground. So the pilot lamp is again illuminated when correct tuning is achieved with the fine tuning knob. Then, when the fine tuning knob is released and returns back to the position shown in FIGURE 2, the pilot lamp remains energized, as it was previous to the pushing in of the fine tuning knob, and the supply to terminal 61 is restored through the contactors 70 and 72 of switch 63, as it was initially. Although a 6 volt pilot lamp might normally be used in television receivers, the pilot lamp in this instance would be of a voltage suitable for use as herein described, such as 28 volts for use with a 24 volt AC supply at 13.

It will be recognized from the foregoing description, that the present invention permits location of the drive motor wherever it can be best accomplished, dependent upon location of the various other components in the receiver. For convenience in the drawing, it is shown with the motor gear box output shaft 79 driving directly into a transfer coupling device 22, one output shaft of which is connected to the UHF tuner and the other of which is connected through a right angle drive box to the VHF tuner. Normally, however, a VHF tuner requires more torque input than does a UHF tuner, so it may be more desirable to locate the drive motor so as to drive the UHF tuner through a right angle drive box and locate the transfer coupling device immediately adjacent the VHF tuner.

Figure 4:
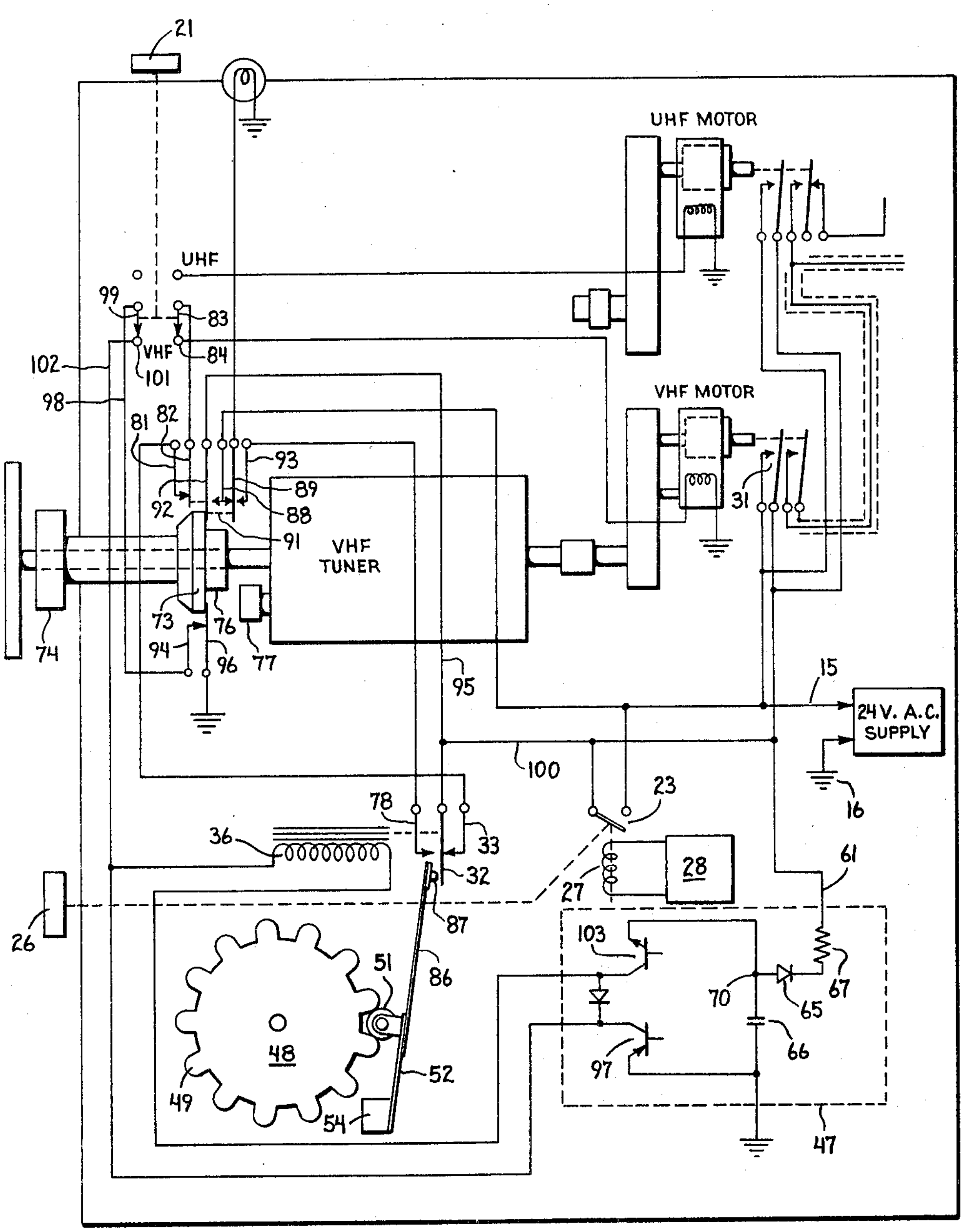
FIGURE 4 is a schematic diagram of another embodiment of the invention.

Another embodiment of the present invention is illustrated in FIGURE 4 wherein several variations from FIGURE 2 are shown, one or more of which may be substituted in the embodiment of FIGURE 2. In this embodiment, two tuner drive motors are employed, one for the UHF tuner and one for the VHF tuner. Each motor has an ocset rotor and a rotor operated switch for the holding circuit thereof. Also, each has rotor-operated switch contacts for audio and picture squelch purposes as with the motor of FIGURE 2. For simplicity in drawings, the shaded-pole windings useful for reverse operations in the UHF motor are omitted, and also the UHF tuner itself is omitted. The selector knob 21 is used for operating a switch to energize the UHF motor in the one switched position, or the VHF motor in the other switched position. In either case, neither motor is energized until the start button 26 is pressed or the remote control coil 27 is energized. The electrical supply at terminals 15 and 16 may be the same. Also the detent wheel 48, cams 49, follower and mount therefor can be the same.

One feature of the embodiment shown in FIGURE 4 is the provision of means for assuring that the drive motor does not continue to operate to drive the tuner past a useful station even though a person might keep the start switch closed too long. For this purpose, both the motor starting circuit and motor holding circuit are wired through the motor stopping switch contacts 32 and 33. For example, for the VHF tuner drive motor, the starting circuit can be traced from the source 15 through the starting switch 23, contacts 32 and 33 of the motor stopping switch, switch contacts 81 and 82, selector switch contacts 83 and 84, and through the motor winding to ground. The motor holding circuit is traced in the same way except that the motor holding switch 31 is inserted in place of the starting switch 23. As soon as the motor stopping relay winding 36 is sufficiently energized to break the contacts 32 and 33, the tuner drive motor will stop regardless of whether or not the starting switch 23 is still being held closed.

Another feature of the embodiment of FIGURE 4 is that, whereas a follower operated switch 56 was employed in parallel with the motor stopping switch in FIGURE 2, there is no separate follower operated switch in FIGURE 4. Instead, the motor stopping switch is arranged for control thereof by the detent follower. For this purpose, the extension 86 mounted to the follower spring and having an insulated outer end button at 87 is positioned so that unless the follower 51 is almost seated in the cam wheel, the tab 87 will keep the contactors 32 and 33 closed regardless of whether or not the motor stopping relay coil 36 is energized. Therefore, during motorized operation of the VHF tuner, motor operation will not stop until the follower is almost seated, although the coil 36 might be energized by signal reception somewhat prior to proper index position of the VHF tuner. Similarly the control of the contactor 32 by the follower preferentially over the coil 36 prevents the tuner from staying on a channel when the start button is pushed even if coil 36 is soon thereafter energized in response to the previously tuned station signal.

In FIGURE 4, the pilot lamp is connected for use in fine tuning the VHF tuner and is normally energized from terminal 15 through switch contacts 88 and 89 to ground. When the fine tuning knob is pushed inwardly to engage gear 76 with gear 77 for fine tuning, the connection between contactors 88 and 89 is broken because of an insulator link 91 between contactors 89 and 92, the latter of which has its lower end pushed inwardly by the flange 73. Separation of contactors 88 and 89 extinguishes the pilot lamp. Then contactor 92 is closed with contactor 88 and contactor 89 is closed with contactor 93. During fine tuning, therefore, when a station is properly tuned, the motor stopping relay coil 36 is energized, making contact between the contactor 32 and contactor 78 to close a circuit through the pilot lamp, this circuit being traceable from the terminal 15 through contactors 88 and 92, then through contactors 32 and 78, then through contactors 93 and 89, and through the pilot lamp to ground.

In FIGURE 4, the circuitry in block 27, and which is not shown in its entirety, is energized through terminal 61 from either the motor starting switch 23 or the motor holding switch 31. However, during manual fine tuning, neither of these switches is closed. Therefore terminal 61 can also be energized when the fine tuning knob is pushed inwardly and the energy is then derived from source 15 through switch contactor 88 and contactor 92 closed therewith and through conductors 95 and 100. Therefore, so long as the fine tuning knob is held inwardly sufficiently to keep contactors 88 and 92 closed, the signal responsive circuitry will remain energized.

One additional feature of the embodiment illustrated in FIGURE 4 is the addition of a shorting switch including contactors 94 and 96, which are normally closed and are used to bypass transistor 97 in the searching circuitry while the system is used for VHF tuning. This is done by grounding one end of the motor stopping relay coil 36 through switch contactors 96 and 94, conductor 98, contactors 99 and 101 of the selector switch, and conductor 102. The other end of the coil is connected to the collector of transistor 103 in the usual manner.

As described in my co-pending application mentioned above, during operation of the search tune circuitry for UHF tuning, the stopping relay will be energized sufficiently to open the stopping switch, only when transistor 103 is conducting in response to reception of the synchronizing signal and transistor 97 is conducting in response to generation of the picture I–F carrier in the receiver. However, the provision of the switches at 94–96, and 99–101, as just described, enables energization of the stopping relay in response to the synchronizing signal only. This eliminates the necessity of having fine tuning in perfect adjustment for VHF channels on which stations are to be received. However, it will be observed that the contactor 96 is separable from contactor 94 upon pushing in the fine tuning knob, so as to enable the manual fine tuning adjustment to be made with the pilot lamp, just as before.

The pilot lamps can be used with manual fine tuning of UHF by merely pushing in on VHF fine tune knob with one hand and turning the UHF manual tune knob with the other, while the selector button is in the UHF position.

From the foregoing description, it should be apparent that the present invention can be incorporated with practically any radio frequency signal receiver and is not necessarily restricted to television. Moreover, variations can readily be made within the scope of the invention. For example, if the television receiver operates from a power transformer whose secondary has one terminal grounded to the chassis and which has an alternating current voltage of 120 to 150, a nominal 120-volt A-C motor could be used, and operated from the transformer secondary with an appropriate dropping impedance. With this arrangement, a resistance voltage divider on the A-C input could be employed for the search circuit D-C supply. Also a smaller filter capacitor could be used for the same time delay in voltage rise of the D-C— supply. Normally, the voltage of the search circuit D-C supply drops when the motor stopping relay actuates, due to the series impedance to the D-C— supply. Therefore, where a 120 volt motor is used with an appropriate dropping impedance, the motor dropping impedance would tend to compensate or the drop in voltage of the D-C— supply when the start button is held in the depressed position or when the motor stopping relay actuates when the circuit is used as a fine tuning indicator. This is because of the smaller A-C voltage drop across the dropping impedance when the motor is off.

While the invention has been disclosed and described in some detail in the drawings and foregoing description, they are to be considered as illustrative and not restrictive in character, as other modifications may readily suggest themselves to persons skilled in this art and within the broad scope of the invention, reference being had to the appended claims.

The invention claimed is:

1. In a television receiver, the combination comprising:
- a continuous tuner and a detent tuner;
- tuner drive motor means;
- selector means coupled to said motor means and operable to enable said motor means to drive a selected one of said tuners at a time;
- a motor starting circuit including a first source of electrical energy, a normally-open starting switch, and said motor means;
- a motor holding circuit including said energy source, said motor means and a first normally-closed electrically-operated motor stopping switch; and
- an operator for said motor stopping switch, said operator being operable when sufficiently energized, to open said stopping switch for de-energizing said motor to stop drive of the tuner.

2. The combination of claim 1 wherein said motor starting circuit includes said first electrically operated stopping switch, to de-energize said motor means when said stopping switch is opened, regardless of the condition of said starting switch when said stopping switch is opened.

3. The combination of claim 2 and further comprising:
- a stopping switch control circuit including in series a second source of electrical energy, signal operated control means, and said operator, said control means being operable in response to a television receiver signal of predetermined character to sufficiently energize said operator to open said stopping switch;
- said second energy source being connectable to said first source through said starting switch, and through a motor operated holding switch in said holding circuit during energization of said motor means, whereby said second energy source is energized.

4. The combination of claim 3 and further comprising voltage rise delay means coupled to said second energy source to delay the rise of voltage therein after connection to said first energy source, to avoid opening of said stopping switch simultaneously with closure of said starting switch and thereby enable said motor means to drive a tuner away from a position producing said receiver signal, upon closure of said starting switch.

5. The combination of claim 4 and further comprising:
first and second detent members associated with one of said tuners and cooperable to stabilize said one tuner in each of a plurality of possible station tuning positions;
one of said detent members being positioned to keep said stopping switch closed independent of said operator to maintain operation of said motor means, until said tuner is almost stabilized in one of said positions.

6. The combination of claim 5 wherein:
said signal operated control means includes the load current paths of first and second signal translating devices in series said first signal translating device being activated in response to a predetermined picture carrier I.F. and said second signal translating device being activated by a synchronizing signal, to sufficiently energize said stopping switch operator when both signal translating devices are activated; the combination further comprising:
a shorting circuit in parallel with the load current path of said first signal translating device, said shorting circuit including a first shorting switch operable by said selector means to open said shorting circuit during drive of said continuous tuner by said motor means and to close said shorting circuit during drive of said detent tuner by said motor means to enable the stopping of said motor means in response to the synchronizing signal alone during drive of said detent tuner.

7. The combination of claim 6 and further comprising:
a manually operable fine tuning member;
and a second shorting switch in said shorting circuit and engageable by said fine tuning member for opening said shorting circuit during actuation of said fine tuning member for fine tuning.

8. The combination of claim 1 and further comprising:
a manually operable fine tuning member;
a pilot lamp;
a first pilot lamp circuit including in series said pilot lamp, said source and a normally-closed lamp control switch;
a second pilot lamp circuit including in series said pilot lamp, said source, and a normally-open electrically-operated tuning indicator switch;
said lamp control switch being engageable by said fine tuning member for opening said control switch during actuation of said fine tuning member for tuning, to thereupon extinguish said pilot lamp, said operator being operable when sufficiently energized both to open said motor stopping switch and also to close said indicator switch to again light said lamp during actuation of said fine tuning member.

9. The combination of claim 8 and further comprising:
first and second detent members associated with said detent tuner and cooperable to stabilize said tuner in each of a plurality of possible station tuning index positions, said first detent member being a detent wheel on said detent tuner and having a plurality of circularly spaced cam lugs thereon defining a plurality of circularly spaced valleys between the cam lugs and corresponding to VHF channel tuning index positions, said detent tuner having tuner strips and strip contacts and a rotatable turret, said contacts being arranged so that station tuning contact is made at various rotational positions of the turret, with one of said valleys being provided to correspond to each of said rotational positions to thereby provide a plurality of channel tuning index positions for said detent tuner turret and detent wheel;
said second detent member including a cam follower roller mounted to a spring and biased thereby to enter and center itself in each of said valleys as said detent tuner is rotated to encourage proper positioning of said detent tuner in each of its index positions;
said detent follower biasing spring having means thereon for controlling switch means in a motor holding circuit to keep said motor means energized and running until said follower is almost seated regardless of whether or not said motor stopping switch operator is energized and thereby avoid cessation of motor operation when said tuner strip contacts are made but said detent tuner has failed to reach a stable index position;
said cams and said follower being so shaped that said spring moves said follower and detent wheel from said almost seated condition to the seated condition after de-energization of said motor, to accurately locate said detent tuner turret in an index position;
a stopping switch control circuit including in series a second source of electrical energy, signal operated control means, and said motor stopping switch operator, said control means being operable in response to a television receiver signal of predetermined character to sufficiently energize said operator to open said stopping switch;
said second energy source being connectable to said first source through said starting switch, and through a motor operator holding switch in said holding circuit during energization of said motor means, whereby said second energy source is energized;
voltage rise delay means coupled to said second energy source to delay the rise of the voltage therein after connection thereof to said first energy source, to avoid sufficient energization of said stopping switch operator until a predetermined time after closure of said starting switch to enable operation of said switch means by said second detent member to maintain closure of said holding circuit after energization of said starting circuit to enable said motor means to drive a tuner off a station on which a sufficiently strong television signal is being received to sufficiently energize said operator, and thus avoid stopping said drive motor means before the tuner has been moved thereby off the station at which it was located immediately prior to closure of said starting switch.

10. The combination of claim 9 and further comprising a normally-open switch closable by said fine tuning member when said lamp control switch is opened by said fine tuning member to thereupon couple said second energy source to said first energy source for energization of said second energy source during actuation of said fine tuning member when both said starting circuit and said holding circuit are open.

11. The combination of claim 10 wherein: said signal operated control means include first and second transistors in series, said first transistor being activated in response to a predetermined picture carrier intermediate frequency and said second transistor being activated by a television synchronizing signal to enable sufficient energization of said stopping switch operator when both transistors are activated.

12. The combination of claim 1 and further comprising:
a motor reversing switch coupled to said motor means and coupled to said continuous tuner and operable by said continuous tuner at predetermined tuner positions to reverse the direction of operation of said motor means;
a defeat switch coupled to said motor means and switchable to a defeat condition disabling the reversal of motor direction by said reversing switch;
said selector means including a selector member movable between a first position, selecting drive of said continuous tuner by said motor means and permitting reversible operation of said motor means, and a second position, selecting drive of said detent tuner by said motor means and placing said defeat switch in said defeat condition to permit operation of said motor means in only one direction.

13. In a television receiver, the combination comprising:

a continuous tuner and a detent tuner;

tuner drive motor means;

selector means coupled to said motor means and operable to enable said motor means to drive a selected one of said tuners at a time;

a control circuit for said motor means, said circuit including an electrically operable motor stopping switch controlling said motor means;

first and second detent members associated with said detent tuner and cooperable to stabilize said tuner in each of a plurality of possible station tuning positions;

one of said detent members being positioned to operate said electrically operable switch independent of and preferentially over electrical operation thereof, to maintain operation of said motor means independent of said electrically operable switch until said detent tuner is almost stabilized in one of said positions.

14. The combination of claim 13 wherein:

said first detent member is a notched wheel connected to said detent tuner;

said second detent member includes a detent follower, and a detent spring biasing said follower against said notched wheel;

said electrically operable switch has a passive contactor and an active contactor in normally closed condition, said switch having an operator magnetically coupled to said active contactor and operable, when energized, to urge and move said active contactor to a second position apart from said passive contactor;

and said second detent member including a portion engageable with said active contactor and operable thereon when said tuner is out of stabilization to maintain the closed condition of said contactor independent of the urging of said switch operator.

15. In a television receiver, the combination comprising:

a continuous tuner and a detent tuner;

tuner drive motor means;

selector means coupled to said motor means and operable to enable said motor means to drive a selected one of said tuners at a time;

a control circuit for said motor means, said circuit including an electrically operable motor stopping switch controlling said motor means;

a detent wheel on said detent tuner and having a plurality of circularly spaced valleys thereon corresponding to channel tuning index positions;

a detent follower received on said detent wheel and biased to enter and center itself in each of said valleys as said detent tuner is rotated, to encourage proper positioning of said detent tuner in each of its index poistions;

and a follower-operated switch in parallel with said motor stopping switch, said follower-operated switch normally being open when said follower is seated in one of said valleys, said follower-operated switch being closed by said follower when said follower is out of its seated condition, to keep said motor energized until said follower is almost seated.

16. The combination of claim 15 wherein said detent tuner has contacts therein for tuner strips, said follower operated switch being operated by said follower when said follower is almost seated, said tuner strip contacts being closed and opened when said follower is more remote from seated condition, whereby motor operation is enabled and maintained even though said tuner is quite near a proper index position.

17. The combination of claim 15 wherein said follower is spring biased, and said valleys and said follower are so shaped that the spring bias moves said follower and detent wheel from the said almost seated condition to the seated condition after de-energization of said motor, to accurately locate said detent tuner in its index position.

18. In a radio frequency signal receiver, the combination comprising:

a radio signal tuner having a plurality of discrete positions for tuning different radio signal transmitting stations at different ones of said positions;

tuner drive motor means;

a motor starting circuit including a first source of electrical energy, a starting switch, and said motor means;

a motor holding circuit including said energy source, said motor means, and a motor stopping switch;

an operator for said motor stopping switch, said operator being operable, when sufficiently energized, to open said stopping switch to stop said motor means from driving said tuner;

detent means on said tuner for moving said tuner into each of said positions from locations in the vicinity of said positions, and for stabilizing said tuner in the position to which it is moved by said detent means;

and operator control means coupled to said operator and responsive to reception of radio frequency signals transmitted from a station tuned by said tuner, for energization of said operator to stop drive of the tuner when a station has been tuned thereby.

19. The combination as set forth in claim 18 and further comprising:

a manually operable fine tuning member;

a pilot lamp;

a first pilot lamp circuit including in series said pilot lamp, said source and a normally-closed lamp control switch;

a second pilot lamp circuit including in series said pilot lamp, said source and a normally-open electrically-operated tuning indicator switch;

said lamp control switch being engageable by said fine tuning member for opening said control switch during actuation of said fine tuning member for operating said tuner, to thereupon extinguish said pilot lamp, said operator being operable, when sufficiently energized, both to open said stopping switch and to also close said indicator switch to again light said lamp during actuation of said fine tuning member, to indicate that a station is properly tuned.

20. The combination as set forth in claim 18 and further comprising a master control member on said detent means and operable by said detent means when said tuner is apart from one of said discrete positions, to keep said motor means energized independent of energization of said stopping switch operator.

21. The combination set forth in claim 18 wherein said motor starting circuit includes said stopping switch to de-energize said motor means when said stopping switch is opened, regardless of the condition of said starting switch when said stopping switch is opened.

22. The combination as set forth in claim 18 wherein said operator control means is energized by said first source through said starting switch when closed, and through a motor operated holding switch in said holding circuit when closed during energization of said motor means.

23. The combination as set forth in claim 18 and further comprising voltage rise delay means coupled to said operator control means to avoid opening of said stopping switch immediately upon closure of said starting switch, and thereby enable said motor means to drive said tuner away from one of said discrete positions at which a station is tuned at the time of closure of said starting switch.

24. The combination as set forth in claim 18 wherein said detent means include a detent cam wheel and detent follower associated therewith, said follower having means thereon for controlling switch means in a motor holding circuit to keep said motor means energized and running until said tuner is almost in a discrete position regardless of whether or not said motor stopping switch operator is energized, and thereby avoid cessation of motor operation when said tuner tunes a station but has failed to reach one of said discrete positions.

25. The combination as set forth in claim 18 wherein said operator control means are responsive to a television synchronizing signal.

References Cited

UNITED STATES PATENTS 3,029,305 4/1962 Marks et al. ---------- 178—5.8

FOREIGN PATENTS 1,067,893 10/1959 Germany.

ROBERT L. GRIFFIN, Primary Examiner

ROBERT L. RICHARDSON, Assistant Examiner

U.S. Cl. X.R.

325—390, 459, 464